United States Patent [19]

Porowski et al.

[11] Patent Number: 5,637,531
[45] Date of Patent: Jun. 10, 1997

[54] METHOD OF MAKING A CRYSTALLINE MULTILAYER STRUCTURE AT TWO PRESSURES THE SECOND ONE LOWER THAN FIRST

[75] Inventors: Sylwester Porowski; Jan Jun; Izabella Grzegory; Stanislaw Krukowski; Miroslaw Wroblewski, all of Warsaw, Poland

[73] Assignee: High Pressure Research Center, Polish Academy, Warsaw, Poland

[21] Appl. No.: 591,595

[22] PCT Filed: Apr. 27, 1994

[86] PCT No.: PCT/PL94/00008

§ 371 Date: Feb. 9, 1996

§ 102(e) Date: Feb. 9, 1996

[87] PCT Pub. No.: WO95/04845

PCT Pub. Date: Feb. 16, 1995

[30] Foreign Application Priority Data

Aug. 10, 1993 [PL] Poland ..................... 300019

[51] Int. Cl.$^6$ .................................. H01L 21/20
[52] U.S. Cl. .................. 117/89; 117/93; 117/952
[58] Field of Search .................... 437/126, 133, 437/105, 107, 112, 132; 148/33.3

[56] References Cited

U.S. PATENT DOCUMENTS

| | | | |
|---|---|---|---|
| 3,829,556 | 8/1974 | Logan et al. | 423/409 |
| 4,144,116 | 3/1979 | Jacob et al. | 156/611 |
| 5,030,583 | 7/1991 | Beetz, Jr. | 437/39 |
| 5,210,051 | 5/1993 | Carter, Jr. | 437/107 |
| 5,239,188 | 8/1993 | Takeuchi et al. | 257/76 |
| 5,290,393 | 3/1994 | Nakamura | 437/133 |
| 5,389,571 | 2/1995 | Takauchi et al. | 437/133 |

FOREIGN PATENT DOCUMENTS

| | | | |
|---|---|---|---|
| 0371771 | 11/1989 | European Pat. Off. | 21/72 |
| 2313976 | 6/1975 | France | 17/2 |

OTHER PUBLICATIONS

D. Ewell et al, Crystal Growth of GaN by the Reaction between Gallium and Ammonia, 2300 Journal of Crystal Growth 66, Jan.–Feb. 1984, pp. 45–54.

P. Perlin et al., Pressure Studies of Gallium Nitride: Crystal Growth and Fundamental Electronic Properties, Physical Review B, vol. 45, No. 23, Jun. 15, 1992, pp. 13 308 —13 313.

S. Porowski et al., Crystal Growth of Semiconductors and Superconductors Under High Gas Pressure, Metals Materials and Processes, vol. 3, No. 4, 1992, pp. 277–284.

I. Grzegory et al., Cyrstal Growth of III–N Semiconductors Under High Nitrogen Pressure Physica B 185 99–102 (1993).

I. Grzegory et al, GaP–GaN Pseudobinary System. Crystal Growth of GaN from the Solution in the Liquid GaP, Jpn. J. Appl. Phys. vo. 32, Suppl. 32–1, 1992, pp. 346–348.

(List continued on next page.)

Primary Examiner—Charles L. Bowers, Jr.
Assistant Examiner—Ramamohan Rao Paladugu
Attorney, Agent, or Firm—Sofer & Haroun, LLP

[57] ABSTRACT

A process for fabricating a multilayer crystalline structure of nitrides of metals from group III of periodic table including GaN, AlN and InN is provided. The process includes the steps of heating a group III metal (26) to a temperature T1 under an equilibrium nitrogen pressure while maintaining group III metal nitride stability to form a first crystal layer of the group III metal nitride. Thereafter the method includes the step of forming a second crystal layer (28) of the group III metal nitride by decreasing the nitrogen pressure such that the second crystal layer grows on the first layer with a growth rate slower than the growth rate of the first layer at a temperature T2 not greater than temperature T1. The second layer (28) grows on at least a portion of the first layer at a predetermined thickness under the new nitrogen pressure.

29 Claims, 4 Drawing Sheets

OTHER PUBLICATIONS

I. Grzegory et al., Stability of Indium Nitride at N2 Pressure up to 20 Kbar High Pressure Research Center, Polish Academy of Sciences.

S. Porowski et al., Synthesis of Metal Nitrides Under High Nitrogen Pressure, p. 21 (cited as Reference 9 in Physica B 185 99–102 (1993) listed above in reference dd).

PCT International Search Report, List of Documents Considered to be Relevant, Apr. 10, 1994.

METHOD OF MAKING A CRYSTALLINE MULTILAYER STRUCTURE AT TWO PRESSURES THE SECOND ONE LOWER THAN FIRST

FIELD OF THE INVENTION

This invention relates to a process of manufacturing crystalline structure and more specifically to crystalline multilayer structures based on nitrides of group III metals, and manufacturing method thereof.

BACKGROUND OF THE INVENTION

Gallium nitride "GaNt" Aluminum nitride "AlN" and Indium nitride "INN" are known as semiconductor compounds of large direct energy gaps. As such they are important electronic materials.

AlN, in the form of ceramic substrate, is applied in high power electronic applications, because of its high heat conductivity, thermal expansion co-efficient close to that of silicon, and good stability at high temperatures.

It has long been known that among the nitrides of group III metals, GaN has potentially the best useful properties as a semiconductor device. Specifically, GaN has semiconducting properties for temperatures up to 600° C. as compared to silicon semiconductor with temperature stability of up to 120° C. The temperature stability and large energy gap of GaN can provide many new high temperature applications for electronic products.

A second important characteristic is that a GaN p-n Junction light emitting diode ("LED") emits visible blue light with a wavelength of approximately 450 nm. GaN has a high efficiency of radiative recombination, and low dislocation mobility. The other semiconductors which are known to emit light in that band are silicon carbide (SIC) and generally $A^{II}B^{VI}$ semiconductors such as ZnSe and $CdF_2$. However, because it is an indirect bandgap material, the luminous efficiency of SiC is only about 0.04 lumen/watt. The $A^{II}B^{VI}$ are known to have high defect mobilities and dislocation densities, which reduce their useful life and the power level at which they can operate. In contrast, it is anticipated that LED's made from GaN would have a luminous efficiency of about 0.6 lumen/watt, and remain extremely stable over time.

Thus-GaN and other group III metal nitrides are viable candidates for applications in short wavelength optoelectronics, blue laser systems, full color display systems and high temperature electronics.

Despite their many advantages, nitrides of group III metals including GaN have not been used extensively because of the many difficulties involved in growing such nitrides in bulk crystals. Their thermodynamic properties preclude the standard techniques for the growth of bulk single crystals, appropriate for commercial use. For instance, the high melting temperature and high $N_2$ pressure at melting, of GaN is in the range where the compound is unstable and readily dissociates. Due to the high melting temperature, the substrate crystals of GaN cannot be obtained by typical crystal growing methods like Czochralski or Bridgman growth from the stoichiometric melts.

Because of the difficulties to produce substances of pure crystalline nitrides of group III metals, the prior art methods use substrates made of materials other than group III nitrides, to develop crystalline nitrides. For example, the nitrides of group III metals like gallium nitride, aluminum nitride, indium nitride or their alloys are deposited on crystalline substrates of different chemical compositions like sapphire or silicon carbide, by Molecular Beam Epitaxy ("MBE") or Metal Organic Chemical Vapor Deposition ("MOCVD").

Specifically atoms of group III metals like gallium and atoms of nitrogen are deposited on a single crystalline substrate by causing them to collide with the substrate. In such known procedures gallium atoms are provided by vaporizing liquid gallium at 1800° C. Nitrogen atoms ere generated from a flow of molecular nitrogen exposed to plasma causing its molecules to dissociate. It is also possible to apply accelerated positive ions by using an electric field for the acceleration to dissociate the nitrogen molecules.

Another prior art method for developing GaN crystal is known as metal organic chemical vapor deposition. Accordingly, the gallium nitride is deposited on a sapphire substrate, by simultaneously applying two chemical reactions: first, decomposing ammonia End second decomposing a metalorganic compound, like trimethylgallium, which is a suitable carrier of gallium. Gallium obtained from the decomposition of the metalorganic compound and the nitrogen derived from ammonia, are deposited on the surface of a sapphire substrate and as a result create a two layer structure. Using a similar method, aluminum nitride deposited on a sapphire substrate has been produced by using trimethylaluminum as a source of aluminum.

Another method for producing gallium nitride crystal is disclosed in the Polish Patent No. 127099. The patent discloses a procedure for crystallization of gallium nitride from a gas phase by sublimation and condensation process under high nitrogen pressure. specifically, according to the disclosed method gallium nitride powder sublimates at temperatures-exceeding 1000° C., at nitrogen pressure higher than 1000 bar. Thereafter, gallium nitride condensation occurs on a sapphire substrate. The temperature difference between the starting material and the substrate would not exceed 500° C.

The procedures disclosed in prior art are therefore mainly limited to the growing of GaN crystal or other group III metal nitride crystals, on a different substrate. Such growth procedures are known as heteroepitaxy production. The gallium nitride structures obtained by such known heteroepitaxy procedures are of low crystalline quality. Their half width at half maximum of the X-ray double crystal reflection curve, known as the rocking curve, is not lower than 200 arcsec, which is not satisfactory for many applications.

One main reason for the poor quality crystals of the prior art is the difference between the lattice constants of the substrates and the deposited layers, which causes a strain field in the structure. The large lattice mismatch, which is 14% for sapphire and 3.4% for SiC substrate, leads to the creation of dislocations, cracking of the layers, island growth and the formation of incoherent boundaries between crystalline grains.

Another difficulty with GaN is its failure to maintain a chemical balance or stoichiometry. Gallium nitride is not stoichiometric because of the high propensity for nitrogen atoms to leave gallium nitride crystals. Therefore, stoichiometric nitrides free of nitrogen vacancies are difficult to obtain. It is commonly believed that the high concentration of nitrogen vacancies is the source of numerous native donor states which are responsible for high free electron concentration observed in group III-nitride semiconductors.

Hence there is a need for multilayer high quality group III metal nitride crystals and consequently n and p type semiconductors derived from such crystals in order to benefit from their potentially important properties.

OBJECTS AND SUMMARY OF THE INVENTION

One object of the present invention is to fabricate a crystalline multilayer gallium nitride structure.

Another object of the invention is to fabricate multilayer crystals based on nitrides of group III metals or their alloys.

Yet a further object of the invention is to obtain gallium nitride crystals with satisfactory growth and quality which can be used in optoelectronics and high temperature electronics.

A further object of the invention Is to deposit different layers of gallium nitride upon a gallium nitride substrate.

Another object of the invention is to produce P type gallium nitride layer to ultimately produce GaN p-n junctions.

Additional objects, advantages and novel features of the invention will be set forth in part in the description which follows.

According to the present invention, the foregoing and other objects and advantages are attained by a method for fabricating a group III metal nitride crystal by homoepitaxial growth. For example in order to achieve a GaN crystal growth, a first layer is grown by melting gallium at a temperature T1 in the range of 400°–2000° C. and exposing the gallium solution to high nitrogen pressure. Instead of nitrogen a mixture of gases containing nitrogen may also be used to obtain a first crystalline layer during a period of about 1 hour. Then the pressure of nitrogen or nitrogen mixture is decreased and a second layer grows at temperature T2 not higher than T1 until the second layer of a desired thickness is obtained. The decrease in pressure is such that the growth rate of the second layer is significantly slower than the growth rate of the first layer. Furthermore, the thickness of the second layer is much less than the thickness of the first layer. Remarkably, a decrease of pressure of about 200 bars or more is usually sufficient to allow the growth of a second layer with better crystalline quality than the first layer. The second layer has better surface flatness, and lower concentration of N-vacancies than the first layer. Thus the resulting crystalline structure is of such quality that allows the attainment of highly desired industrial applications mentioned above. Typically the width of x-ray rocking curve of the second layer is about 20 arcsec and the difference between the width of rocking curves for first and second layers is about 10 arcsec. The x-ray rocking curve indicates an improvement by a factor of 10, over prior art crystalline structures.

According to another aspect of the invention, once the first layer of GaN is formed, its position is changed. Meanwhile, the pressure of nitrogen is decreased. The first layer is then subjected to thermal or chemical treatment at temperatures higher than 300° C. and, finally, its surface is covered by atoms of gallium metals present in the atmosphere or present in the flow of nitrogen gas. The atoms of gallium metals can emanate from vapors, beam of atoms, metal compounds containing gallium or metalorganic compounds containing gallium metal. Consequently a second layer of GaN crystal deposits on a previous layer of GaN crystal at a significantly slower growth rate than the growth rate of the previous layer.

Once the two layer structure is obtained according to the present invention the next layers may be deposited by known methods in the art like chemical vapor deposition, molecular beam epitaxy or plasma phase epitaxy.

Other objects and advantages of the present invention will become readily apparent to those skilled in the art from the following detailed description, wherein only the preferred embodiments have been shown and described.

DETAILED DESCRIPTION OF THE DRAWINGS

Figure 1:
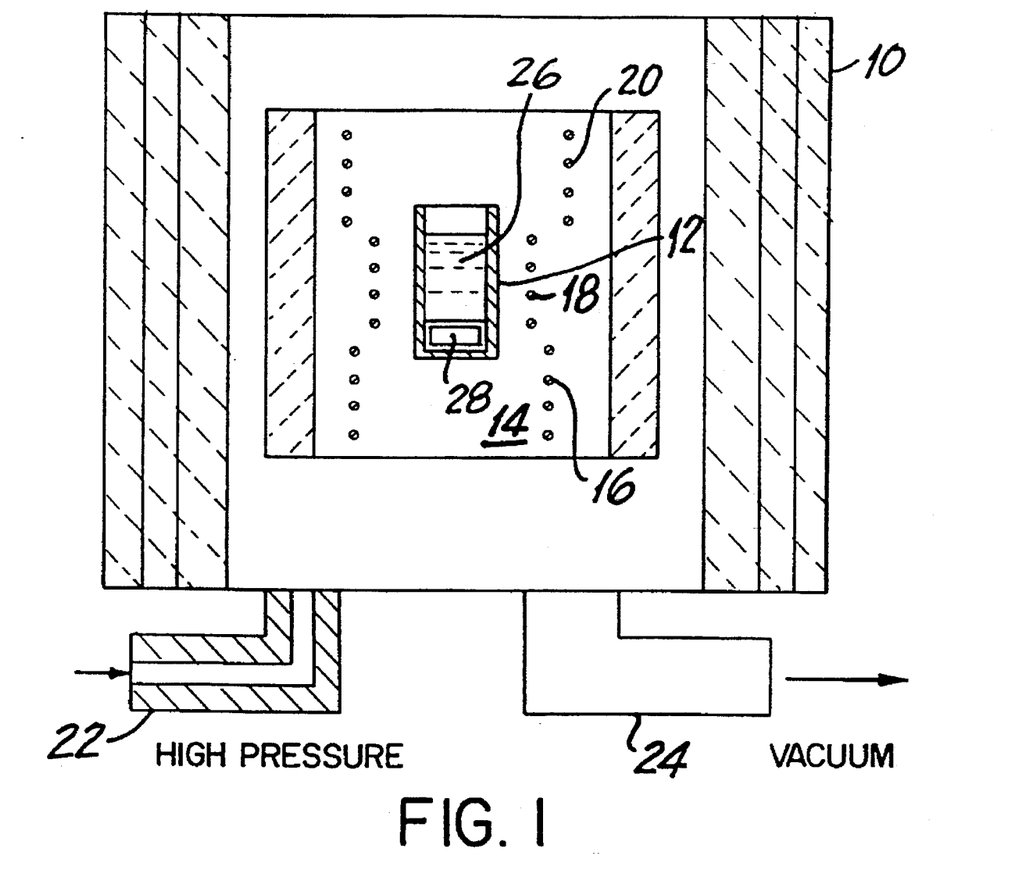
FIG. 1 illustrates a high pressure system used to develop group III metal nitride crystals according to one embodiment of the present invention.

FIG. 1 illustrates a high pressure chamber 10 used to fabricate group III metal nitride crystals of the present invention. A boron nitride crucible 12 for holding group III metals or their alloys is placed in a three zone furnace 14, designed for work at high gas pressures of up to 20 kbar. The furnace 14 with the crucible 12 is placed in the high pressure chamber 10. The furnace 14, consists of three temperature zones 16, 18 and 20 supplied by electric currents of different values. The desired pressure is provided by adjusting the input pressure to chamber 10 by connecting a gas compressor (not shown) to the chamber through a high pressure inlet 22 and a vacuum outlet 24.

According to the invention, a multi-layer group III nitride crystal is made in chamber 10. Instead of pure group III metals discussed above, group III metal alloys can also be used to attain a crystalline growth. Group III metal alloys are any combination of group III metals that result in a crystalline growth. Since III-N compounds are fully miscible, where III is a group III metal and N is nitrogen, many combinations of such group III metals can be used to grow crystalline layers according to the present invention.

A sample 26 of a metal from group III of the periodic table or group III metal alloy as defined above is placed in crucible 12. Thereafter the crucible is placed in the three zone furnace 14. The furnace with the crucible is then placed in the high pressure chamber 10. The crucible is placed near zone 16 with temperature Td, and zone 18 with higher temperature $T_e$ such that the furnace causes a temperature gradient in the metal sample. The chamber is filled with nitrogen gas or a gas mixture containing a certain percentage of nitrogen. The metal sample is thus exposed to a pressure of nitrogen or partial nitrogen pressure. Temperatures $T_d$ and $T_e$ are both above the metal's melting point and the nitrogen pressure is such that the metal sample remains in the form of a liquid solution.

During the growth of the first crystalline layer, the pressure of nitrogen is high enough to maintain GaN stability for the entire metal sample solution which is exposed to heat zones 16 and 18. The first crystal layer is grown for a period of about 5 hours. The growth period is discretionary and depends on the desired thickness and mechanical strength of the crystalline layer. Typically a first layer with a thickness of few millimeters is appropriate for many applications.

Thereafter the pressure of the nitrogen or partial nitrogen pressure in the mixture is decreased by about 200 bars or more. With the decrease in pressure, the portion of the sample exposed to the warmer zone 18 with temperature $T_g$ comes out of GaN stability range and liquid phase metal contacts directly with gaseous nitrogen, while the portion of the solution exposed to the cooler zone 16 with temperature $T_d$ remains in GaN stability range. The second crystal layer grows at temperature $T_d$ at a significantly slower growth rate than the first layer until the second layer of a desired thickness is obtained. The thickness of the second layer is less than the thickness of the first layer and is typically around ½ micron. Therefore, although the growth rate of the second layer is much less than the growth rate of the first layer, the growth period necessary to grow a second layer with a desired thickness is comparable with and in some instances less than the growth period of the first layer.

Figure 2:
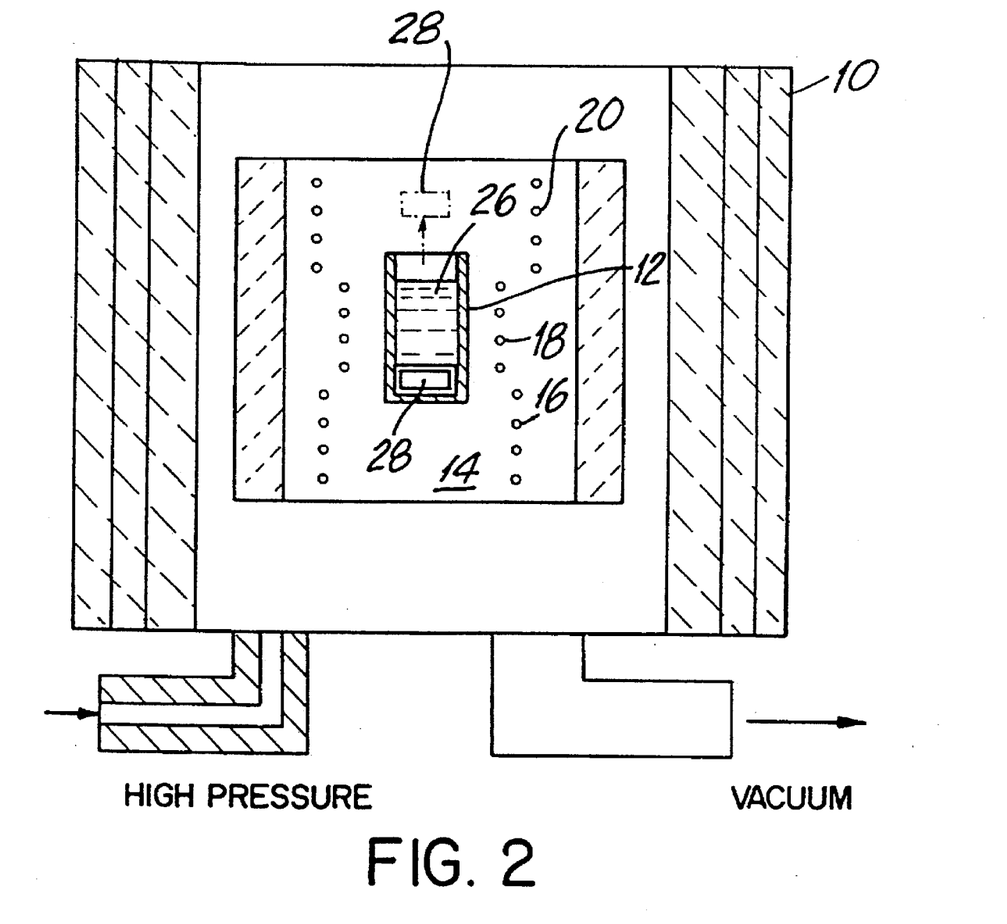
FIG. 2 illustrates the high pressure system used to develop the crystals according to another embodiment of the present invention.

According to another embodiment of the invention, as illustrated in FIG. 2, after the first crystalline layer is obtained, together with decreasing pressure of nitrogen, the first crystalline layer is moved to zone 20 with temperature $T_i$, which is lower than both $T_d$ and $T_g$. Thereafter the first crystalline layer is subjected to a chemical or thermal treatment. At lower pressure of nitrogen, the metal solution in crucible 12 turns into vapor phase and begins to evaporate towards zone 20 and in combination with nitrogen flow causes the growth of a second layer 28 in zone 20 over the first layer. In the alternative, the atoms of group III metals can be obtained from vapors, beam of atoms or compounds of these metals or from decomposition of metalorganic compound in atmosphere or flow of nitrogen or gases containing nitrogen.

The temperatures $T_g$ and $T_d$ at which the metal is first heated are in the range of 400°–2000° C. at a specified pressure of nitrogen. The necessary pressure of nitrogen can be determined based on the pressure-temperature curve of the group III metal nitride.

Figure 3A:
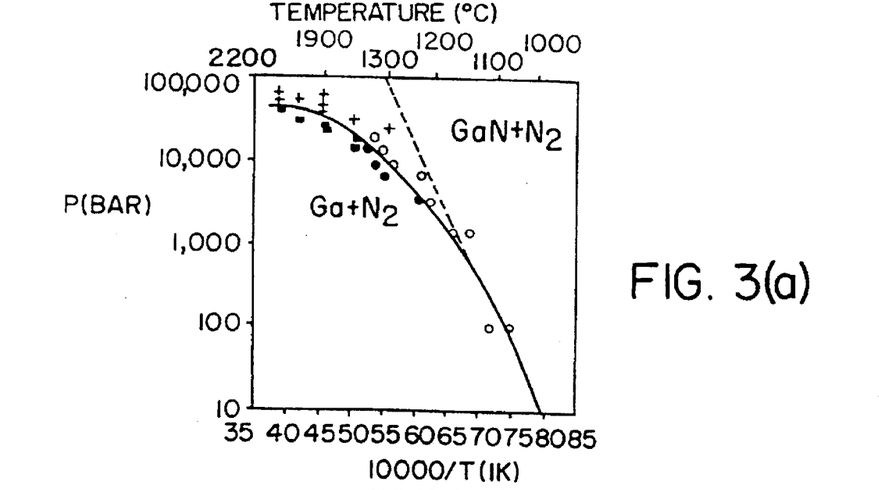
FIGS. 3a–3c illustrate the pressure-temperature curves for GaN, AlN and InN respectively.
Figure 3B:
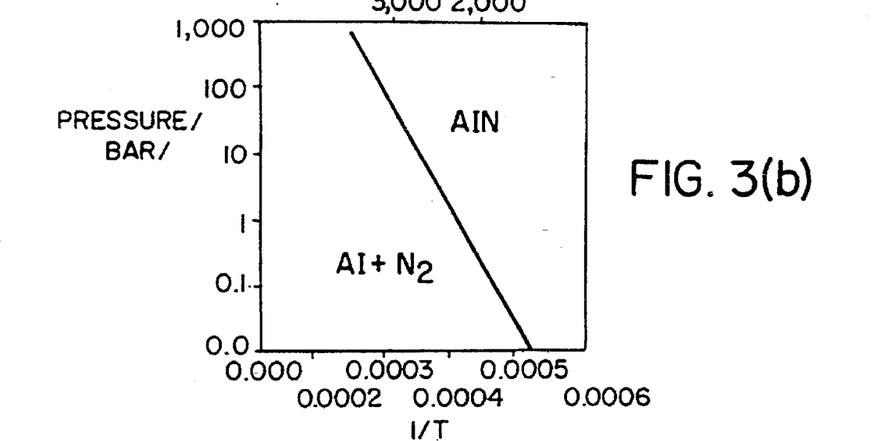
Figure 3C:
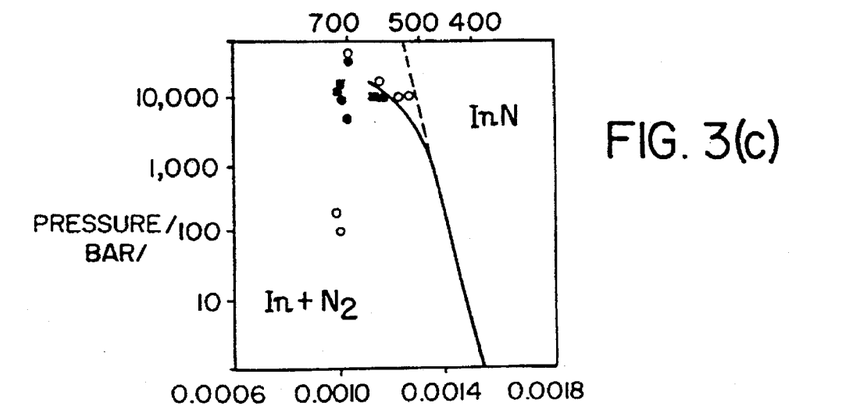

FIG. 3(a) illustrates the pressure-temperature curve of GaN. FIG. 3(b) illustrates the pressure-temperature curve of AlN, and FIG. 3(c) illustrates the pressure temperature curve of InN. The pressure-temperature curves illustrate the minimum required pressure of $N_2$ at different temperatures, under which the compound remains within a stability range. As illustrated, the higher the temperature of the nitride compound, the higher the pressure required to maintain the stability condition. Therefore, the area to the left of the curves represents pressure and temperature conditions under which no metal nitride stability is achieved and the area to the right of the curves represents metal nitride stability conditions.

Thus for GaN, the desired pressure of $N_2$ at a specified temperature T is higher than the equilibrium pressure $P_{N2eq}$(T), according to the equilibrium state as illustrated by the pressure-temperature curve of FIG. 3(a). Furthermore, the desired pressure of $N_2$ is preferably lower than three times the equilibrium pressure $P_{N2eq}$(T). At higher pressures the quality of the obtained crystal begins to deteriorate. If the gas provided in the chamber is not pure nitrogen and only partially contains nitrogen, the minimum nitrogen content in the gas mixture is preferably about 20% or more.

For AlN, the pressure of gas is in the range of 200 bar to 10 kbar. This pressure range prevents Al evaporation and gas phase reaction, as illustrated by the pressure-temperature curve of FIG. 3(b). In the event that the gas provided in the chamber only partially contains nitrogen, the minimum nitrogen content in the gas mixture is about 1% or more.

When pure nitrogen is used to develop a multilayer AlN crystalline structure, the desired pressure decrease necessary for growing the second layer with a sufficiently slow growth rate to develop a high quality crystal layer is about 6.4 kbars. In the alternative the temperature change is adjusted to decrease the growth rate of the second layer with high quality characteristics. Therefore, during pure nitrogen growth of AlN crystal the first layer is grown at pressures of 6.5 kbar or more, and the second layer is grown at a low pressure of 0.1 kbar and less.

Finally for InN, the desired pressure of $N_2$—similar to GaN—is higher than the equilibrium pressure $P_{N2eq}$(T), according to the equilibrium state as illustrated by the desired pressure-temperature curve of FIG. 3(c). Furthermore, the pressure of $N_2$ is preferably lower than three times the equilibrium pressure. At higher pressures the obtained crystal begins to deteriorate.

According to the present invention, the generation of nitrogen vacancies in the substrate is avoided due to the pressure growth technique disclosed herein. The concentration of free electrons in pressure grown crystals depends on growth temperature but also on the growth rate of the crystal. In the crystals growing slower, this concentration can be substantially reduced.

According to another embodiment of the present invention, doping of the first and the second layer is achieved by the addition of small amounts, of around 10%, of other metals er non-metals to the metal sample 26, in order to introduce impurities in the growing crystalline layers. Such impurities include Zn, Mg, Cd, Si or P. An example of a resulting crystalline layer is a ternary system III-X-N, where III is a group III metal, X is an impurity and N is nitrogen, with a solidus which contains only one solid phase, that is, the nitride doped with the impurity X up to 1at. %. Group III metal alloys for growing GaN crystalline structure may contain any combination of In, Al, Si, Mg, Zn, Ce, Bi, and P.

Higher order crystalline structures containing more than one impurity can also be grown. The partial group III metal having about 10 at. % of dopants and its crystallization by methods described above results in a doped group III metal nitride crystal and partial compensation of free electrons. The resulting impurity content in the crystal is about 0.1 at. %.

For obtaining p-type conductivity it is necessary to reduce N-vacanies content. This is achieved by either crystallization of the second layer from the vapor phase described above at high $N_z$ pressure, or by annealing an n-type crystal doped with acceptors like Mg or Zn, at temperatures higher than 1500° C. at high $N_2$ pressures.

Three examples for growing a multilayer group III nitride crystal using the homoepitaxy growth of the present invention is herein described. It can be appreciated by those skilled in the art that the same examples are applicable to crystal growths of AlN, InN and their alloys.

EXAMPLE 1

Figure 4:
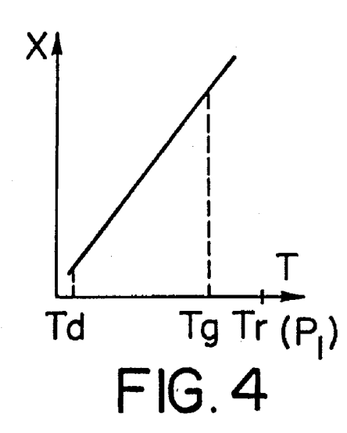
FIG. 4 represents the dependence of temperature, T, as a function of position X in a sample of liquid gallium during the crystallization of the first layer.
Figure 5:
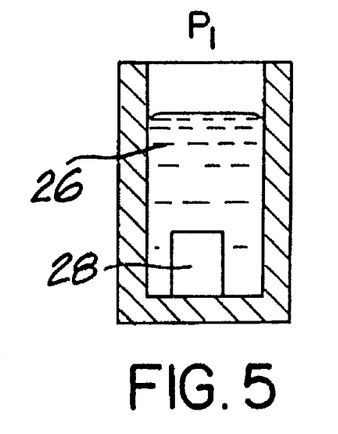
FIG. 5 illustrates the sample of liquid gallium during the crystallization of the first layer.
Figure 6:
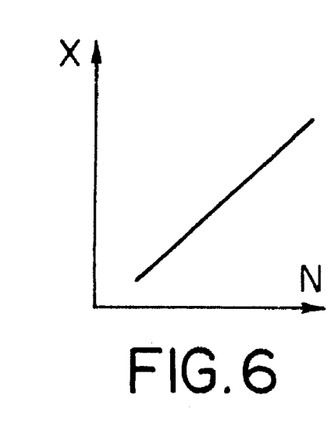
FIG. 6 illustrates the concentration of nitrogen N, as a function of position X in the sample of liquid gallium during the crystallization of the first layer.

During the operation of furnace 14, the nitrogen in the chamber is compressed under a pressure $P_1$ of approximately 10 kbar. The system is then heated to reach the conditions for growth of GaN crystals from nitrogen solution in the liquid gallium, in a temperature gradient illustrated in FIG. 4. Accordingly FIG. 4 illustrates the temperature T as a function of position X in the sample of liquid gallium in crucible 12 during the crystallization process of the first layer. Temperature $T_d$ of zone 16 is maintained at 1350° C. and temperature $T_g$ of zone 18 is maintained at 1410° C. Under pressure $p_1$ the equilibrium temperature $T_r$ is greater than both temperatures $T_d$ and $T_g$. FIG. 5 illustrates crucible 12 with 2 cm³ gallium sample 26 shown in liquid form. FIG. 6 illustrates the concentration of nitrogen N, as a function of position X in the sample of liquid gallium during the crystallization process of the first layer. As illustrated, the concentration of nitrogen in the liquid gallium sample increases with the increasing temperature.

Figure 7:
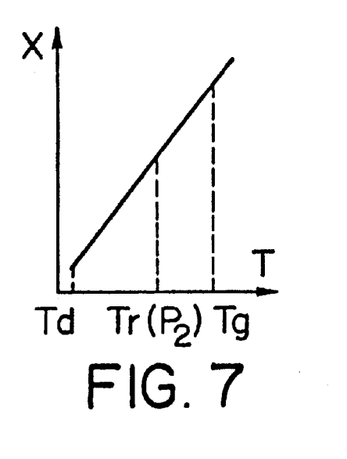
FIG. 7 represents the dependence of temperature, T, as a function of position X in the sample of liquid gallium during the crystallization of the second layer.
Figure 8:
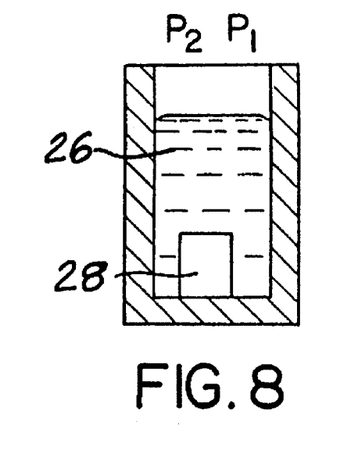
FIG. 8 illustrates the sample of liquid gallium during the crystallization of the second layer.
Figure 9:
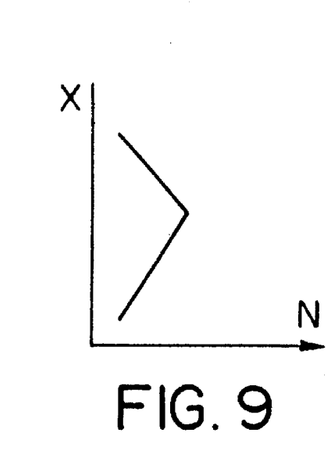
FIG. 9 illustrates the concentration of nitrogen N, as a function of position X in a sample of liquid gallium during the crystallization of the second layer.

As mentioned above, the process is carried out at conditions where GaN is stable in the entire temperature range. Therefore, the highest temperature of the sample, 1410° C., does not exceed the equilibrium temperature (Tr) for coexistence of three phases GaN, liquid Ga and $N_2$ gas, corresponding to the nitrogen pressure of 10 kbar. In these conditions the surface of the liquid gallium begins to be covered by a thin GaN crystalline layer. Due to the temperature gradient in the system, nitrogen dissolved in the warmer part of the crucible is transported, by diffusion and convection, to the cooler part where GaN crystals in the form of single crystalline hexagonal platelet grow from the supersaturated solution as a first substrate layer. In an 8 hour process the crystal reaches the dimensions of 0.5×2×2 mm. The next step according to the present invention is the homoepitaxial growth of a second crystalline layer at a growth rate slower than the growth rate of the first layer, in a lower supersaturation controlled by the change of pressure and temperature of the process. Thus, the pressure in the system is decreased by 1000 bar which changes the distribution of concentration of nitrogen in the liquid gallium 26 of FIG. 8, based on the curve illustrated in FIG. 9. The equilibrium temperature for pressure of 9000 bar is between the temperatures of the warmer and the cooler parts of the crucible as illustrated by FIG. 7. Under this condition, as illustrated by FIG. 9, in the warmer part of the crucible, gallium nitride is not stable and the liquid phase gallium has a direct contact with gaseous phase nitrogen.

The solubility of the gas in Ga, in contrast to the solubility of GaN, is a decreasing function of temperature. The chemical potential of gas, at constant pressure, decreases with temperature due to rapidly decreasing density. Similarly for the same temperature as the pressure decreases the solubility of nitrogen in Ga also decreases. The change in temperature dependence of nitrogen concentration in the solution leads to the lowering of the supersaturation in the growth region of the solution. At the conditions of this example, the average growth rate of the layer is of order of $10^{-3}$ mm/h. The width of the rocking curve for the layer deposited on GaN crystal is typically 20–24 arcsec. The lowering of the supersaturation and the slower growth rate provides for the growth of a better quality crystal.

Furthermore, during the growth of the second layer, the part of the gallium sample with temperature $T_g$ above the equilibrium temperature $T_r$ is not covered by the GaN surface crust. The second layer grown at these conditions has better qualities than the first substrate layer. It can be appreciated by those skilled in the art that the decrease of pressure in the second step should be such that the equilibrium temperature remains between the temperatures of zone 16 and 18 of the furnace. Otherwise, no stable region in the sample remains and the GaN crystal can readily decompose.

EXAMPLE 2

FIG. 2 illustrates the second embodiment of the invention. The process of growth of the first gallium nitride layer, which is the substrate crystal in the form of the hexagonal plate, is carried out as explained above in reference to FIG. 1, at a nitrogen pressure of approximately 10 kbar, in a temperature gradient provided by zones 16 and 18, during an 8 hour crystallization process, until GaN crystal with dimensions of 0.5×2×2 mm is obtained. In the next step of the process, the crystal is displaced to temperature zone 20 in the furnace, where its temperature is approximately 1250° C. Simultaneously, the pressure of nitrogen is decreased by 2000 bar. At lower pressure conditions, the substrate crystal is thermodynamically stable, whereas the liquid gallium evaporates easily. As illustrated in FIG. 3(a), the temperature 1410° C. at zone 18 is higher than the equilibrium temperature necessary for GaN stability at 8000 bar. Then, Ga vapors are transported by convection towards the substrate and deposited on it, reacting with nitrogen to form the second layer of GaN. Since the second layer is grown in $N_2$-rich side of the phase diagram, the resulting crystal has low concentration of N-vacancies.

It can be appreciated by those skilled in the art that depending on temperature in the decrease of pressure in the second step should be such that the new decreased pressure be high enough to prevent decomposition of GaN substrate, yet be low enough to allow sufficient evaporation of the gallium liquid. Consequently, if the growth of the second layer is performed at low temperatures, for example, lower than 900°–1000° C., the pressure can be decreased to even less than 1 bar, since at low temperatures GaN remains in a metastable state.

It can also be appreciated by those skilled in the art that at lower temperatures mentioned above, it is also possible to grow the second crystal layer by Molecular beam epitaxy or chemical vapor deposition or plasma phase epitaxy methods.

EXAMPLE 3

Using growth techniques discussed above a $Ga_{0.98}In_{0.02}N$ was grown from the solution containing 90 at. % Ga and 10 at. % In, at $N_2$ pressure of 10 kbar in a temperature range of 1200° C. to 1300° C.

Once the two layer structure is fabricated according to the present invention, it is possible to add more layers by CVD or MBE processes. This enables growth of multilayer structures such as superlattices and heterostructures.

Consequently, the present invention teaches a method to fabricate multi-layer crystals of group III metal nitrides, while avoiding the disadvantages of prior art fabrication methods. The homoepitaxy growth of the present invention provides a good quality crystal with many potential applications in optoelectronics and high temperature electronics.

We claim:

1. A process for fabricating a multilayer crystalline structure wherein said layers are nitrides of metals from group III of periodic table, said process comprising the steps of:
   (a) heating a group III metal (26) to a temperature T1 under an equilibrium nitrogen pressure maintaining group III metal nitride stability to form a first crystal layer of said group III metal nitride; and
   (b) forming a second crystal layer (28) of said group III metal nitride by decreasing the nitrogen pressure to a given pressure of not lower than one bar such that said second crystal layer grows on the first layer with a growth rate slower than the growth rate of the first layer at a temperature T2 not greater than temperature T1, said second layer (28) growing on at least a portion of said first layer at a given thickness under the new nitrogen pressure.

2. The invention according to claim 1 wherein instead of said group III metals, group III metal alloys are used.

3. The invention according to claim 1 wherein said temperature T1 is in a range of about 400° C. to about 2000° C.

4. The invention according to claim 3 wherein said step (a) further includes a step of controlling said equilibrium nitrogen pressure, for a given temperature T1, to be within a range defined by a first and a second nitrogen pressure, said first nitrogen pressure being the minimum pressure under which said group III metal nitride remains stable and said second nitrogen pressure is not more than three times said first nitrogen pressure.

5. The invention according to claim 4 wherein said first crystal layer is obtained after at least one hour.

6. The invention according to claim 5, wherein after said step (b) the method further comprises the step of depositing on said second layer additional crystalline layers of said group III metal nitride by molecular beam epitaxy or metal organic chemical vapor deposition or plasma phase epitaxy techniques.

7. The invention according to claim 6, wherein said group III metal is gallium and said multilayer crystal is gallium nitride crystal.

8. The invention according to claim 6, wherein said group III metal is aluminum and said pressure is in the range of 200 bar to 10 kbar depending on the temperature of the metal during the crystal growth.

9. The invention according to claim 6, wherein said group III metal is Indium and said multi-layer crystal is Indium nitride crystal.

10. A process for fabricating a multilayer crystalline structure wherein each said layer is a nitride of at least one metal from group III of periodic table comprising the steps of:

(a) heating said group III metal (26) to a temperature T1 under an equilibrium first nitrogen pressure, to form a first crystal layer of group III metal nitride from a solution of said group III metal;

(b) removing said formed first crystal layer;

(c) maintaining the temperature of said removed first crystal layer at about 300° C. or higher, under a second nitrogen pressure which is less than said first nitrogen pressure; and (d) exposing said removed first crystal layer to atoms of said group III metal in atmosphere or flow of nitrogen to form a second crystal layer (28) on said first crystal layer.

11. The invention according to claim 10 wherein said atoms of said group III metal are obtained from vapors of said metal (26).

12. The invention according to claim 11 wherein said temperature T1 is in the range of about 400° C. to about 2000° C.

13. The invention according to claim 12, wherein said atoms of said group III metal are obtained from group III metal alloys.

14. The invention according to claim 12, wherein said atoms of said group III metal are obtained by decomposition of metalorganic compound including said group III metal.

15. The invention according to claim 14, wherein after said step (d) the process further comprises the step of depositing additional crystalline layers of said group III metal nitride by low pressure growth techniques including molecular beam epitaxy or metal organic chemical vapor deposition or plasma phase epitaxy techniques.

16. The invention according to claim 15, wherein said group III metal is gallium and said multilayer crystal is made of gallium nitride crystal.

17. The invention according to claim 16 wherein said group III metal contains impurities for doping said first and said second crystal layers.

18. The invention according to claim 17 wherein said step (d) further includes the step of doping with a p-type dopant during growth of said second crystal layer to obtain a doped crystal.

19. A process for fabricating a multilayer gallium nitride crystal comprising the steps of:

(a) heating a gallium sample (26) in a multizone furnace (14) disposed in a high pressure chamber (10), said gallium sample (26) at one portion is exposed to a first temperature zone (16) and at the remaining portion is exposed to a second temperature zone (18);

(b) inserting gas containing nitrogen in said high pressure chamber;

(c) subjecting said gas to a first nitrogen pressure such that the resulting equilibrium temperature in the chamber is larger than the temperature at said first and said second temperature zones (16) and (18) so that a first layer of gallium nitride crystal is formed on said gallium sample (26); and (d) decreasing the nitrogen pressure to a second nitrogen pressure such that said equilibrium temperature decreases to a temperature larger than the temperature of said first temperature zone (16) and smaller than the temperature of said second temperature zone (18) so that a second layer (28) of gallium nitride crystal is developed on the first layer near said first temperature zone (16).

20. The invention according to claim 19, wherein said first temperature zone is maintained at about 1350° C. and said second temperature zone is maintained at about 1410° C., and said first nitrogen pressure is at about 10 kbar, and said second nitrogen pressure is at about 9 kbar.

21. The invention according to claim 20, wherein after said step (d) the process further comprises the step of depositing additional layers of gallium nitride crystal by low pressure technique including molecular beam epitaxy or metal organic chemical vapor deposition or plasma phase epitaxy.

22. The invention according to claim 21, wherein said step (d) further includes the step of doping with a p-type dopant during growth of said second crystal layer to obtain a doped GaN crystal.

23. The invention according to claim 22 wherein said step(a) further comprises the step of combining said gallium sample (26) with additional impurities to form at least a ternary system crystalline structure.

24. The invention according to claim 23 wherein said addition impurity is about 10 at. % of said gallium sample, and is about 1 at. % of said ternary system crystalline structure.

25. The invention according to claim 24 wherein said impurities include Zn, Mg, Cd, Si or P.

26. A process for fabricating a multilayer gallium nitride crystal comprising the steps of:

(a) heating a gallium sample (26) in a multizone furnace (14) disposed in a high pressure chamber (10), said gallium sample (26) at one portion is exposed to a first temperature zone (16) and at the remaining portion is exposed to a second temperature zone (18);

(b) inserting gas containing nitrogen in said high pressure chamber;

(c) subjecting said gas to a first nitrogen pressure such that the resulting equilibrium temperature in the chamber (10) is larger than the temperature of said first and said second temperature zones (16) and (18), so that a first gallium nitride crystal is formed on said gallium sample;

(d) removing said formed first layer of gallium nitride crystal to a third temperature zone (20) in said furnace (14), said third temperature zone having a temperature below said first and said second temperature zones (16) and (18); and (e) decreasing the nitrogen pressure to a second nitrogen pressure such that the equilibrium temperature remains larger than the temperature of said third temperature zone (20) and becomes less than the temperature of at least a portion of said gallium sample (26) so that a second layer (28) of GaN crystal is formed under gallium vapor phase on said first layer in said third temperature zone (20).

27. The invention according to claim 26, wherein said first temperature zone (16) is maintained at about 1350° C., and said second temperature zone (18) is maintained at about 1410° C., and said third temperature zone (20) is maintained at about 1250° C., and said first nitrogen pressure is at about 10 kbar and said second nitrogen pressure is at about 8 kbar.

28. A multilayer crystalline structure having at least two layers comprising:

a first crystalline layer of group III metal nitride; and a second crystalline layer of group III metal nitride having lower nitrogen vacancy and higher surface flatness than said first layer.

29. The invention according to claim 28 wherein said crystalline layers are doped by n-type and p-type impurities.

* * * * *